(12) United States Patent
Lai et al.

(10) Patent No.: US 9,529,139 B2
(45) Date of Patent: Dec. 27, 2016

(54) LIGHT SOURCE MODULE

(71) Applicant: PIXART IMAGING INC., Hsin-Chu County (TW)

(72) Inventors: Hung-Ching Lai, Hsin-Chu County (TW); Hung-Yu Lai, Hsin-Chu County (TW); Yu-Hsiang Huang, Hsin-Chu County (TW)

(73) Assignee: Pixart Imaging Inc., Hsin-Chu County (TW)

( * ) Notice: Subject to any disclaimer, the term of this patent is extended or adjusted under 35 U.S.C. 154(b) by 176 days.

(21) Appl. No.: 14/540,187

(22) Filed: Nov. 13, 2014

(65) Prior Publication Data

US 2015/0212255 A1    Jul. 30, 2015

(30) Foreign Application Priority Data

Jan. 28, 2014   (TW) .............................. 103103411 A

(51) Int. Cl.
| | | |
|---|---|---|
| *F21V 8/00* | (2006.01) | |
| *H01L 33/54* | (2010.01) | |
| *H01L 33/58* | (2010.01) | |
| *H01L 33/62* | (2010.01) | |
| *H01L 33/60* | (2010.01) | |

(52) U.S. Cl.
CPC .......... *G02B 6/0055* (2013.01); *G02B 6/0045* (2013.01); *H01L 33/54* (2013.01); *H01L 33/58* (2013.01); *G02B 6/0065* (2013.01); *G02B 6/0078* (2013.01); *H01L 33/60* (2013.01); *H01L 33/62* (2013.01)

(58) Field of Classification Search
CPC ........... G06B 6/0046; G06B 6/55; G06B 6/45; G06B 6/78; H01L 33/54; H01L 33/58; H01L 33/60; H01L 33/62
See application file for complete search history.

(56) References Cited

U.S. PATENT DOCUMENTS

| | | | |
|---|---|---|---|
| 5,876,107 A  * | 3/1999 | Parker | G02B 6/0018 |
| | | | 362/231 |
| 2001/0030860 A1 | 10/2001 | Kimura et al. | |
| 2002/0061178 A1* | 5/2002 | Winston | F21V 5/02 |
| | | | 385/133 |

FOREIGN PATENT DOCUMENTS

| | | |
|---|---|---|
| CN | 101097053 A | 1/2008 |
| CN | 201910441 U | 7/2011 |
| JP | S49-51154 U | 5/1974 |
| JP | S58-204575 A | 11/1983 |
| JP | H07176794 A | 7/1995 |
| JP | H07-202270 A | 8/1995 |

* cited by examiner

*Primary Examiner* — Anne Hines
(74) *Attorney, Agent, or Firm* — Rosenberg, Klein & Lee

(57) ABSTRACT

There is provided a light source module including an LED die and a light guide member. The light guide member is formed by injection molding to encapsulate the LED die. The light guide member is coated with a reflection film on a part of surface thereof and has at least one tilted surface opposite to the LED die.

20 Claims, 5 Drawing Sheets

LIGHT SOURCE MODULE

RELATED APPLICATIONS

The present application is based on and claims priority to Taiwanese Application Number 103103411, filed Jan. 28, 2014, the disclosure of which is hereby incorporated by reference herein in its entirety.

BACKGROUND

1. Field of the Disclosure

This disclosure generally relates to a light source module and, more particularly, to an embedded LED light source module.

2. Description of the Related Art

In conventional optical systems, in order to fulfill different requirements of the light source, a light bar can be designed with various shapes to guide the propagation path of light entering the light bar from outside. The light bar generally has an entrance surface for light coupling with an active light source to allow light emitted from the active light source to enter the light bar and thus the active light source is the element actually providing the light. However, a complicated process of light coupling between the active light source and the entrance surface has to be performed so as to improve the optical coupling efficiency as much as possible.

For example, FIG. 1 is a schematic diagram of the conventional light source system which includes an LED package 9 and a light bar 8 independent from each other, wherein the light bar 8 has an entrance surface 81 to allow light to enter the light bar 8 therethrough. In order to allow the light emitted from the LED package 9 to effectively enter the light bar 8 through the entrance surface 81, the emission angle and the disposed distance of the LED package 9 have to be designed previously and then the assembly process can be performed. This manufacturing process is complicated and the light leakage still can not be fully eliminated.

SUMMARY

Accordingly, the present disclosure further provides a light source module in which the light emitting diode (LED) die, the lead frame and/or the substrate are directly integrated inside a light guide member so as to improve the utilization efficiency of light and simplify the manufacturing process of the optical system.

The present disclosure provides a light source module in which the LED die is directly embedded in a light guide member and a reflection film is coated on the surface of the light guide member for defining the ejection position of light of the light guide member thereby fulfilling the illumination requirement of the optical system.

The present disclosure further provides a light source module formed by co-injection molding that may be manufactured together with other elements of the optical system thereby simplifying the manufacturing process.

The present disclosure provides a light source module including an LED die, a lead frame and a light guide member. The lead frame is electrically coupled to the LED die. The light guide member encapsulates the LED die and a part of the lead frame and includes at least one tilted surface opposite to the LED die, wherein a part of surface of the light guide member is coated with a reflection film.

The present disclosure provides a light source module including an LED die, a lead frame, at least one light guide member, a light pipe and a pipe holder. The lead frame is electrically coupled to the LED die. The at least one light guide member encapsulates the LED die and a part of the lead frame and includes at least one tilted surface opposite to the LED die, wherein a part of an ejection surface of the light guide member is coated with a reflection film. The light pipe is combined to a lateral surface of the light guide member. The pipe holder is configured to secure the light pipe.

The present disclosure further provides a light source module including a pipe holder and at least one light guide member. The at least one light guide member is combined to the piper holder and includes an ejection surface, a tilted surface and an LED die embedded at an end of the light guide member far from the tilted surface, wherein the tilted surface is configured to reflect light emitted from the LED die toward the ejection surface.

In one aspect, the LED die is an infrared light emitting diode die. The reflection film is an infrared reflective film configured to reflect the light emitted from the LED die.

In one aspect, the light source module further includes a bearing member co-injection molded with the light guide member and covering at least an opposite surface opposite to the ejection surface of the light guide member, wherein a combination plane between the bearing member and the light guide member is not coated with the reflection film, and a material refractive index of the bearing member is lower than a material refractive index of the light guide member.

In one aspect, the pipe holder includes at least one receiving hole configured to accommodate an end of the at least one light guide member close to the LED die. The pipe holder further in eludes an electrical contact therein configured to electrically coupled to the exposing part of the lead frame when the at least one light guide member is inserted into the receiving hole, wherein the electrical contact is electrically connected to an external power source.

In one aspect, the light pipe and the light guide member are formed by co-injection molding. A combination plane between the light pipe and the light guide member is not coated with the reflection film, and a material refractive index of the light pipe is lower than a material refractive index of the light guide member.

In one aspect, the light guide member is combined to the pipe holder by means of an adhesive or a fastening member. Otherwise, the pipe holder includes at least one receiving hole configured to accommodate an end of the at least one light guide member close to the LED die.

In one aspect, the light guide member further includes at least one saw tooth structure or at least one reticulated structure to allow a pall of light emitted from the LED die to eject from the light guide member via the saw tooth structure or the reticulated structure thereby adjusting the ejected light.

In one aspect, the light guide member includes a plurality of tilted surfaces having different tilted angles so as to reflect the light emitted from the LED die toward different directions thereby adjusting the illuminated area.

In the light source module according to some embodiments of the present disclosure, the light guide member directly encapsulates the LED die using injection molding such that the light coupling is no longer necessary in the assembly process. In addition, the light guide member may be secured to a pipe holder directly, or combined to a light pipe at first and then combined to the pipe holder, wherein the light pipe is configured to, for example, guide visible light and the light guide member is configured to guide infrared light, e.g. infrared light with the wavelength longer than 700 nm.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

Figure 1:
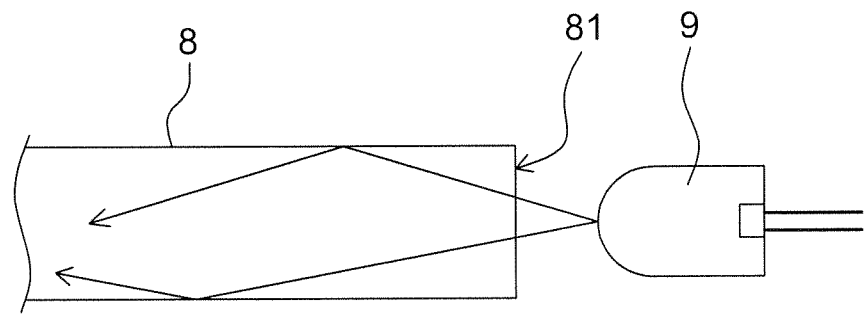
FIG. 1 is a schematic diagram of the light coupling between the conventional light bar and the active light source.
Figure 2A:
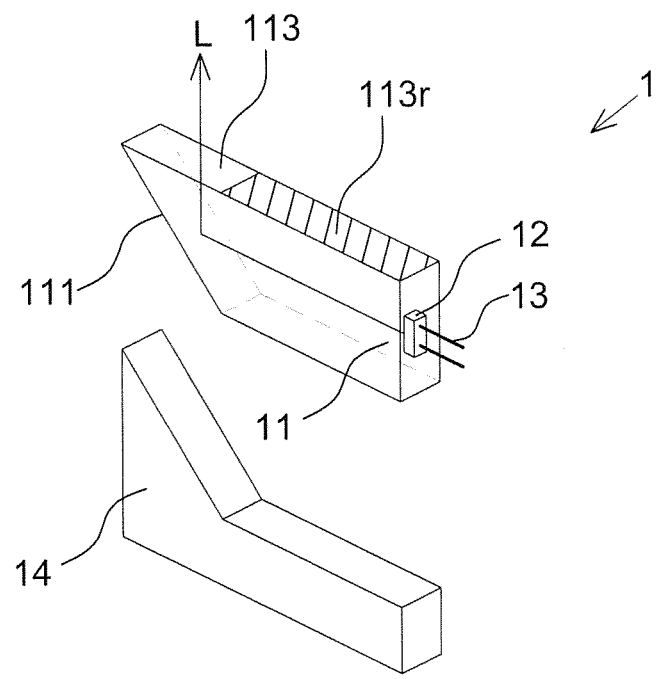
FIG. 2A is a schematic diagram of the light source module according to a first embodiment of the present disclosure.

Referring to FIG. 2A, it is a schematic diagram of the light source module according to a first embodiment of the present disclosure. In the light source module 1, the light emitting diode (LED) die 12 is directly embedded in a light guide member 11, wherein the lead frame 13 is electrically coupled to the LED die 12 configured to electrically couple the LED die 12 to a power source (not shown) which is configured to drive the LED die 12 to emit light. In this manner, the light coupling between the active light source and the light guide member needs not to be performed so as to simplify the manufacturing process and improve the utilization efficiency of light. According to different structures of the LED module, in other embodiments a substrate of the LED module is also embedded inside the light guide member 11. In other words, in the present disclosure only the electrical contact (e.g. a part of lead frame 13) of the LED module is exposed outside of the light guide member 11 and other parts of the LED module are directly embedded inside the light guide member 11. The light guide member 11 is made of, for example, plastic or epoxy material and transparent to the light emitted by the LED die 12.

It should be mentioned that in the present disclosure the lead frame 13 include two conductors for electrical coupling, and the two conductors are respectively served as the electrode of different polarities (e.g. anode electrode and cathode electrode).

In one embodiment, the LED die 12 is an infrared light emitting diode die configured to emit infrared light with the wavelength longer than 700 nm. It should be mentioned that the light wavelength emitted by the LED die 12 is determined according to different applications without particular limitation.

In one embodiment, in order to control an emission direction of the LED die 12, the lead frame 13 includes a cup-shaped concave configured to accommodate the LED die 12 and define the emission direction toward a front of the cup-shaped concave.

The light guide member 11 is formed by injection molding to encapsulate the LED die 12 and a part of the lead frame 13, and another part of the lead frame 13 is exposed outside of the light guide member 11 for electrical coupling to an external power source. The light guide member 11 has at least one tilted surface 111 (e.g. one tilted surface being shown herein) and an ejection surface 113, wherein the tilted surface 111 is opposite to the LED die 12 configured to reflect the light emitted from the LED die 12 toward the ejection surface 113. For example, the tilted surface 111 is opposite to the cup-shaped concave or opposite to an emitting surface of the LED die 12. In one embodiment, the tilted surface 111 has an included angle of 45 degrees relative to the ejection surface 113. It should be mentioned that the included angle between the tilted surface 111 and the ejection surface 113 is determined according to a relative position between the LED die 12 and the tilted surface 111. When the relative position between the tilted surface 111 and the LED die 12 is changed, said included angle may be relatively adjusted without particular limitation as long as the light emitted from the LED die 12 is reflected toward the ejection surface 113.

In addition, a part of surface of the light guide member 11 is coated with a reflection film so as to prevent the light leakage. For example, surfaces other than the ejection surface 113 are all coated with the reflection film so as to prevent the light leakage. In addition, at least a part of the ejection surface 113 is not coated with a reflection film (e.g. 113*r*), e.g. the region not filled with the inclined lines in FIG. 2A. Accordingly, the light L may eject from the light guide member 11 via the region not coated with the reflection film (e.g. 113*r*). It is appreciated that the coated region of the reflection film (e.g. 113*r*) on the ejection surface 113 is determined according to different applications and is not limited to those shown in the figures of the present disclosure. In addition, the light wavelength reflected by said reflection film is determined according to the light emitted by the LED die 12, and the reflection film is not limited to be the infrared reflection film.

In one embodiment, the light source module 1 further includes a bearing member 14 integrated with the light guide member 11. For example, FIG. 2A shows that the bearing member 14 covers an opposite surface (e.g. including a bottom surface and the tilted surface 111 herein) of the ejection surface 113 of the light guide member 11. For example in one embodiment, the bearing member 14 is adhered to the opposite surface through the adhesive (e.g. liquid optical clear adhesive). In another embodiment, the bearing member 14 and the light guide member 11 are formed by co-injection molding. For example, the bearing member 14 and the light guide member 11 are both made of plastic or epoxy material, and a material refractive index of the bearing member 14 is lower than a material refractive index of the light guide member 11. In this manner, due to the emission angle of the LED die 12, the emitted light is difficult to penetrate into the bearing member 14 from the light guide member 11, and in this case said opposite surface may not be coated with the reflection film. In other words, on the light guide member 11, the region possibly having light leakage is coated with the reflection film but the region without light leakage needs not to be coated with the reflection film.

In addition, the bearing member 14 may cover other surfaces of the light guide member 11 and is not limited to be covered on the bottom surface and the tilted surface 111 of the light guide member 11 as shown in FIG. 2A.

Figure 2B:
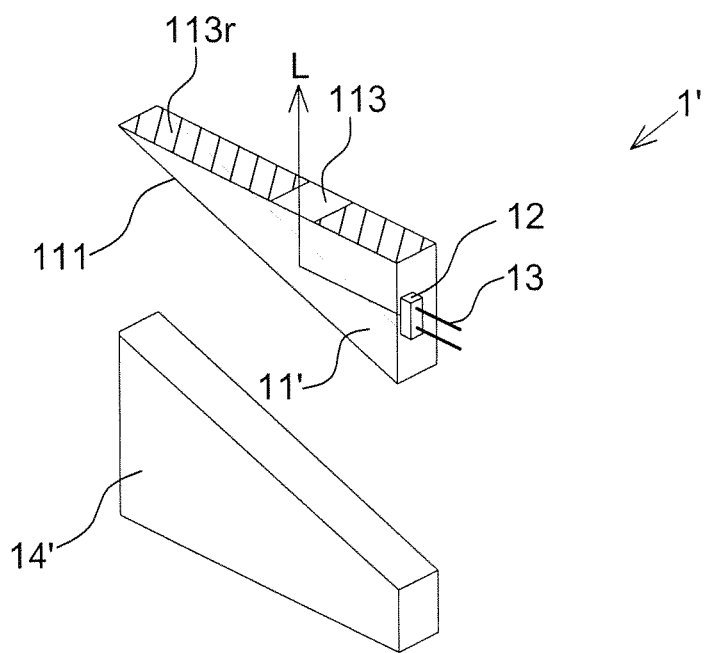
FIG. 2B is another schematic diagram of the light source module according to the first embodiment of the present disclosure.

It should be mentioned that the shape of the light guide member 11 shown in FIG. 2A is not to limit the present disclosure. For example, FIG. 2B shows that the light guide member 11' is manufactured having a cross section of a right triangle and the LED die 12 is disposed opposite to the tilted surface 111 to allow the tilted surface 111 to be able to reflect the light emitted from the LED die 12 toward the ejection surface 113. The shape of the bearing member 14' does not have particular limitation as long as including a surface corresponding to the tilted surface 111. In other words, in the present disclosure shapes of the light guide member 11 and the bearing member 14 do not have particular limitation.

Figure 3A:
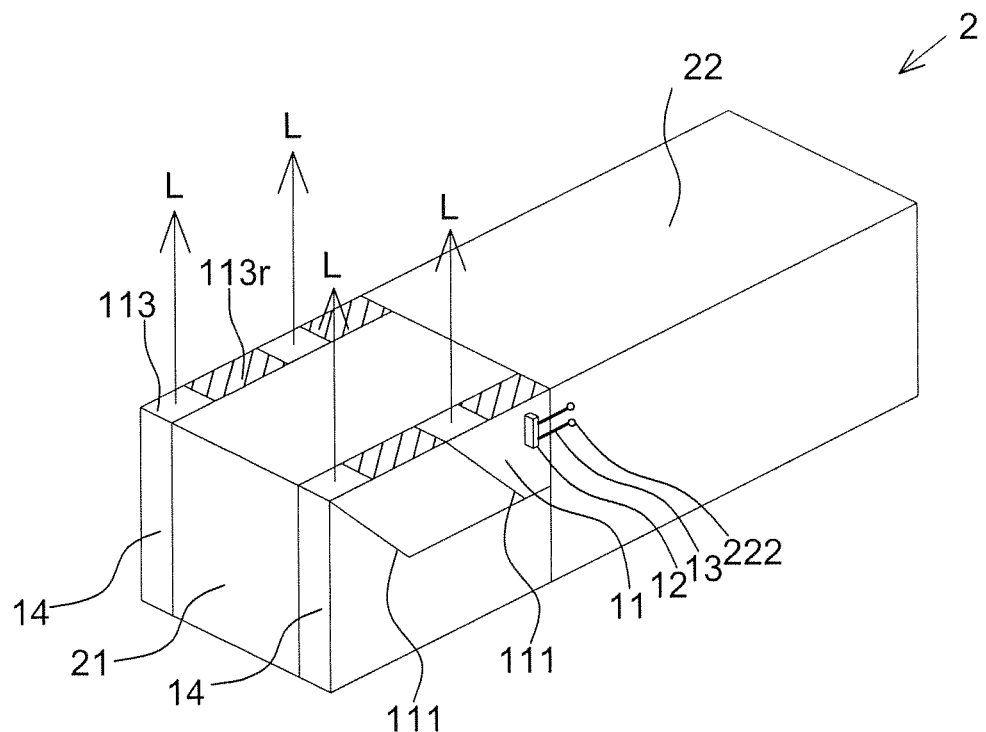
FIG. 3A is a solid diagram of the light source module according to a second embodiment of the present disclosure.
Figure 3B:
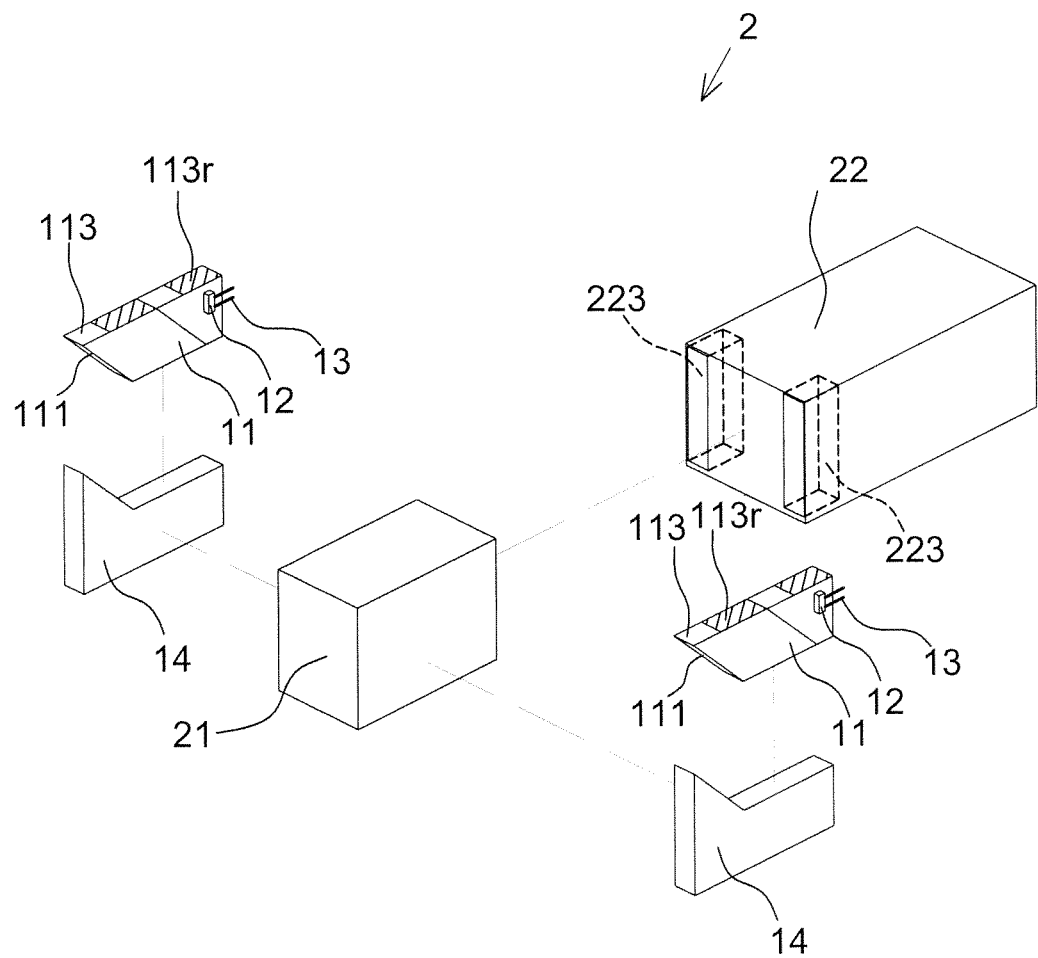
FIG. 3B is an exploded view of the light source module of FIG. 3A.

Referring to FIGS. 3A and 3B, they are schematic diagrams of the light source module according to a second embodiment of the present disclosure, wherein FIG. 3B is an exploded view of FIG. 3A. In this embodiment, the light source module 2 includes at least one light guide member 11 of the first embodiment or at least one light source module 1 (e.g. two light source modules 1 being shown herein), wherein the light guide member 11 is substantially identical to that of the first embodiment. The difference is that in FIG. 3A the light guide member 11 has two tilted surfaces 111 configured to reflect light L emitted from the LED die 12 toward two regions of the ejection surface 113 to leave the light guide member 11, wherein each tilted surface reflects, for example, 50 percent of light, but not limited thereto. The tilted surface inside the light guide member 11 may be formed as an air filled interface during manufacturing inside the light guide member 11 to be served as a partially reflective surface. It is appreciated that a number of the tilted surfaces 111 is determined according to the illumination requirement without particular limitation.

In this embodiment, the light source module 2 further includes a light pipe 21 and a pipe holder 22, and a surface of the light pipe 21 is secured to a surface of the pipe holder 22. For example, the light pipe 22 is adhered to the pipe holder 22 using the adhesive (e.g. liquid optical clear adhesive). The light pipe 21 and the pipe holder 22 are configured to, for example, transmit visible light such as red light, green light and blue light.

The light pipe 21 is combined to a lateral surface of the light guide member 11. In one embodiment, the light pipe 21 is adhered to a lateral surface of the light guide member 11 using, for example, the adhesive (e.g. liquid optical clear adhesive). In another embodiment, the light pipe 21 and the light guide member 11 are formed by co-injection molding and a material refractive index of the light pipe 21 is lower than a material refractive index of the light guide member 11, wherein the light pipe 21, the light guide member 11 and the pipe holder 22 are made of, for example, plastic or epoxy material. Accordingly, due to the emission angle of the LED die 12, the emitted light is difficult to penetrate into the light pipe 21 from the light guide member 11, and in this case the lateral surface may not be coated with the reflection film.

Figure 4:
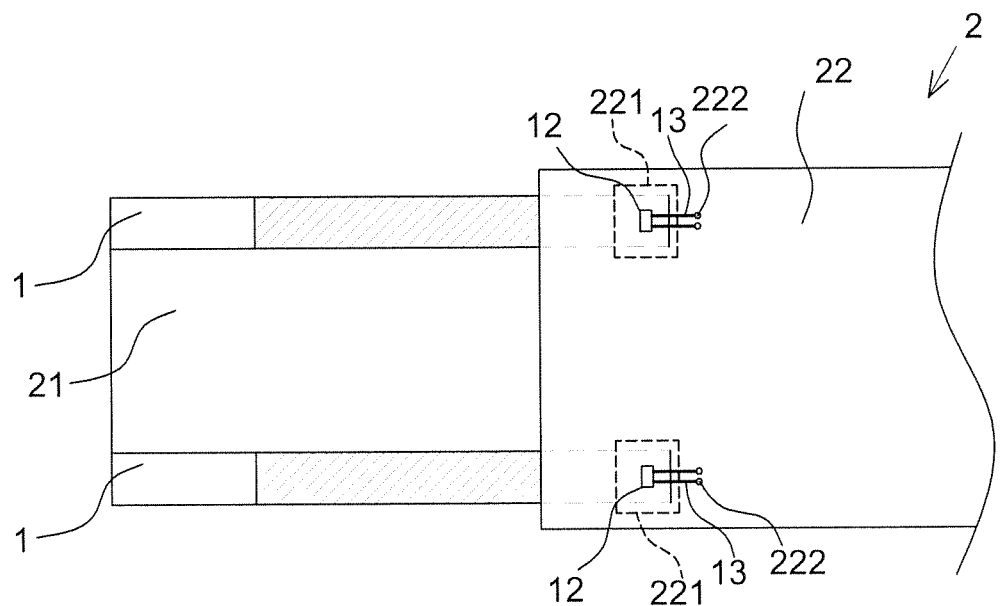
FIG. 4 is an upper view of the light source module of FIG. 3A.

The pipe holder 22 is configured to be combined to the light pipe 21, and is made of infrared transparent material or infrared-opaque material according to its applications. In one embodiment, the pipe holder 22 is also served as the emission component of the system light source, and the pipe holder 22 may further include at least one infrared pass filter 221, as shown in FIG. 4, to allow infrared light to eject. It is appreciated that if the ends of the light guide members 11 are not inserted into the pipe holder 22, said infrared pass filter 221 may not be implemented.

FIG. 4 is an upper view of the light source module 2 of FIG. 3A. Herein the pipe holder 22 has at least one receiving hole 223 (e.g. two receiving holes being shown in FIG. 3B) configured to accommodate an end of the light guide member 11 close to the LED die 12. In this manner, when the light pipe 21 is combined to the surface of the pipe holder 22, an end of the light guide member 11 close to the LED die 12 is inserted into the receiving hole 223. In this embodiment, the infrared pass filter 221 of the pipe holder 22 is disposed, for example, corresponding to the position of the LED die 12. In other embodiments, the position of the infrared pass filter 221 is determined according to the system requirement.

In the second embodiment, the light source module 2 may further include a bearing member 14 as well which is integrated with the light guide member 11. In one embodiment, a length of the light guide member 11 is different from that of the bearing member 14 such that when the light pipe 21 is combined to the pipe holder 22, only the end of the light guide member 11 is inserted into the pipe holder 22. In another embodiment, the size of the receiving hole 223 is arranged to simultaneously accommodate ends of both the light guide member 11 and the bearing member 14, and a length of the light guide member 11 is substantially identical to that of the bearing member 14 such that when the light pipe 21 is combined to the pipe holder 22, the ends of both the light guide member 11 and the bearing member 14 are inserted into the pipe holder 22.

In other embodiments, the pipe holder 22 does not have the receiving hole, and the light guide member 11, the bearing member 14 and the light pipe 21 are adhered to a surface of the pipe holder 22 through the adhesive.

In addition, the pipe holder 22 further includes at least one electrical contact 222 therein configured to electrically coupled to the exposing part of the lead frame 13 when the at least one light guide member 11 is inserted into the receiving hole 223, wherein said electrical contact 222 is electrically coupled to a power source (not shown).

Figure 5:
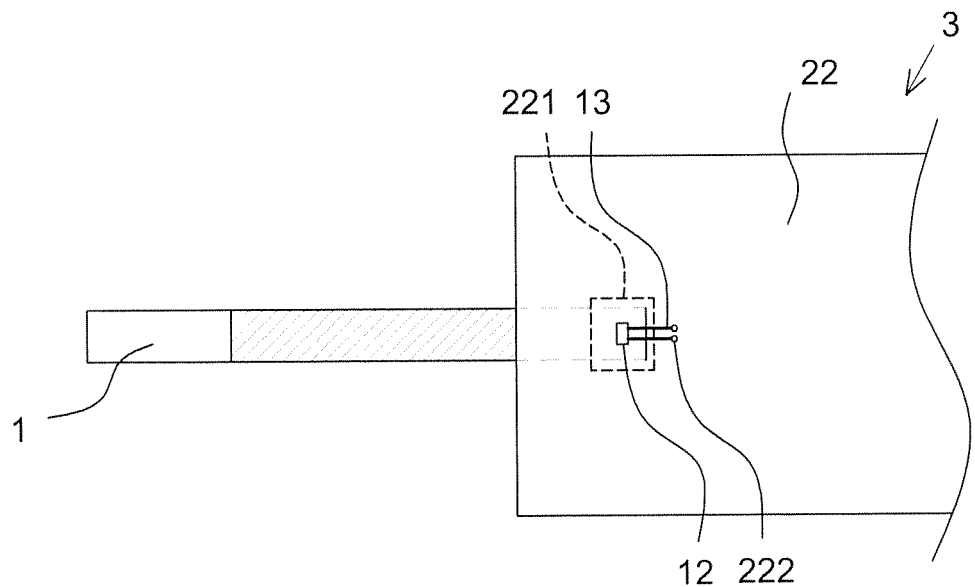
FIG. 5 is an upper view of the light source module according to a third embodiment of the present disclosure.

Referring to FIG. 5, it is an upper view of the light source module 3 according to a third embodiment of the present disclosure. In the above second embodiment, the light pipe 21 is designed for the specific purpose, e.g. for guiding visible light. However in other embodiments, the light pipe 21 may not be implemented. Accordingly, in the third embodiment of the present disclosure, the light source module 3 only includes one pipe holder 22 and at least one light guide member 11 or at least one light source module 1 (e.g. one light source module 1 being shown herein), wherein the at least one light guide member 11 is combined to the pipe holder 22 and has an ejection surface and a tilted surface (e.g. the reference numerals 111 and 113 in the first embodiment). The light guide member 11 includes an LED die 12 embedded in the light guide member 11 and at an end far from the tilted surface (as shown in FIG. 2A), wherein the tilted surface is configured to reflect the light emitted from the LED die 12 toward the ejection surface. As described in the first embodiment, the tilted surface is arranged to be able to reflect the light emitted from the LED die 12 toward the ejection surface without particular limitation.

The light guide member 11 may be combined to the pipe holder 22 using an adhesive or a fastening member (for example, but not limited to, the screw). Otherwise, the pipe holder 22 may include a receiving hole (as shown in FIG. 3B) configured to accommodate an end of the at least one light guide member 11 close to the LED die 12. Similarly, the electrical contact may be disposed in said receiving hole configured to electrically coupled to the exposing part of the lead frame 13 when the at least one light guide member 11 is inserted into the receiving hole.

In the third embodiment, the light guide member 11 may be combined together with a bearing member (e.g. the element 14 shown in FIGS. 2A and 2B) by co-injection molding. As described in the second embodiment, the size of said receiving hole 223 is arranged to be able to accommodate the ends of both the light guide member 11 and the bearing member 14 or to accommodate only the end of the light guide member 11 according to its requirements.

It should be mentioned that although FIG. 5 shows only one light guide member 11, it is not to limit the present disclosure. A number of the light guide member 11 is determined according to the system requirement. In addition, as mentioned above the coated position of the reflection film on the ejection surface of the light guide member 11 is determined according to the system requirement, and surfaces other than the ejection surface may all be coated with the reflection film, but not limited thereto.

The light source module of the present disclosure may be applied to the pupil positioning system, and the light L ejecting from the ejection surface not coated with the reflection film is used to illuminate an eyeball, and the reflected light from the eyeball is received by an image sensor for outputting image frames. An image processing unit then performs the pupil positioning according to bright dots in the image frames. The visible light guided by the light pipe 21 may be used to project images, e.g. applied to the LCOS projection system.

Figure 6:
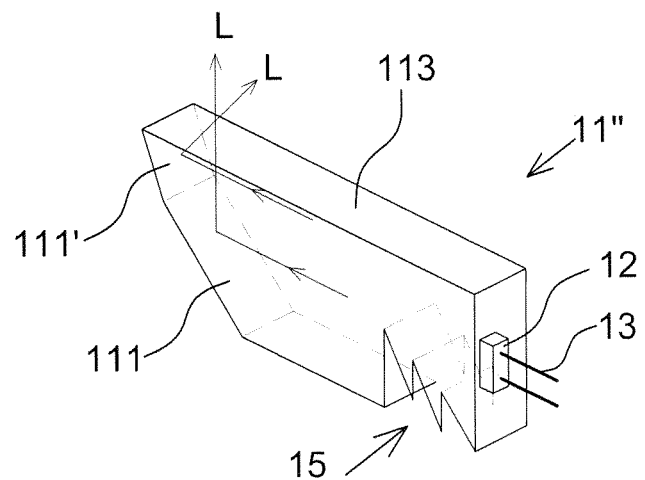
FIGS. 6-7 are other schematic diagrams of the light guide member according to some embodiments of the present disclosure.

Referring to FIG. 6, it is another schematic diagram of the light guide member 11" according to one embodiment of the present disclosure, wherein the light guide member 11" has a saw tooth structure 15 for breaking the total reflection condition such that a part of light emitted from the LED die 12 may eject from the light guide member 11" via the saw tooth structure 15 thereby controlling the amount of light ejecting from the ejection surface 113. Similarly, in this embodiment a part of the ejection surface 113 and surfaces other than the ejection surface 113 (not including the saw tooth structure 15) are optionally coated with the reflection film so as to prevent the light leakage. In addition, according to different requirements of the light source, the light guide member 11" has a plurality of tilted surfaces (e.g. 111, 111') having different tilted angles so as to control the direction of light leaving the light guide member 11". It should be mentioned that the size, position and number of the saw tooth structure 15 in FIG. 6 are only intended to illustrate but not to limit the present disclosure. The arrangement of the saw tooth structure 15 is determined according to the amount of light required, e.g. another saw tooth structure may be formed in the lateral surface (not the ejection surface) of the light guide member 11". In addition, the tilted angle and number of the tilted surface shown in FIG. 6 are only intended to illustrate but not to limit the present disclosure.

Figure 7:
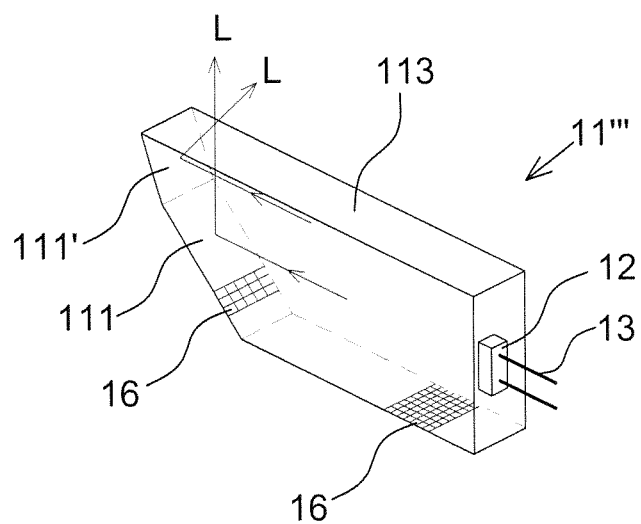

Referring to FIG. 7, it is another schematic diagram of the light guide member 11'" according to one embodiment of the present disclosure, wherein the light guide member 11'" has a reticulated structure 16 for breaking the total reflection condition such that a part of light emitted from the LED die 12 may eject from the light guide member 11'" via the reticulated structure 16 thereby controlling the amount of light ejecting from the ejection surface 113. The reticulated structure 16 may be formed by ink printing. Similarly, in this embodiment a part of the ejection surface 113 and surfaces other than the ejection surface 113 (not including the reticulated structure 16) are optionally coated with the reflection film so as to prevent the light leakage. In addition, according to different requirements of the light source, the light guide member 11'" has a plurality of tilted surfaces (e.g. 111, 111') having different tilted angles so as to control the direction of light leaving the light guide member 11'". It should be mentioned that the size, position and number of the reticulated structure 16 in FIG. 7 are only intended to illustrate but not to limit the present disclosure. The arrangement of the reticulated structure 16 is determined according to the amount of light required, e.g. another reticulated structure may be formed in the lateral surface (not the ejection surface) of the light guide member 11'". In addition, the tilted angle and number of the tilted surface shown in FIG. 7 are only intended to illustrate but not to limit the present disclosure.

As mentioned above, in the conventional optical system the complicated light coupling between the light bar and the active light source separated from each other has to be performed such that the assembling is time-consuming and the optical coupling efficiency is an issue to be considered. Therefore, the present disclosure further provides a light source module (FIGS. 2A-2B, 3A and 5) in which the LED die is directly manufactured inside the light guide member so as to improve the utilization efficiency of light such that the light coupling is no longer necessary during manufacturing. In addition, the light guide member may be manufactured together with other system elements by co-injection molding thereby simplifying the assembly process.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:
1. A light source module comprising:
    an LED die;
    a lead frame electrically coupled to the LED die;
    at least one light guide member encapsulating the LED die and a part of the lead frame, and comprising at least one tilted surface opposite to the LED die, wherein a part of an ejection surface of the light guide member is coated with a reflection film;
    a light pipe combined to a lateral surface of the light guide member; and
    a pipe holder configured to secure the light pipe and comprising at least one receiving hole configured to accommodate an end of the at least one light guide member close to the LED die.

2. The light source module as claimed in claim 1, wherein the light guide member comprises a plurality of tilted surfaces having different tilted angles.

3. The light source module as claimed in claim 1, wherein the at least one tilted surface has an included angle of 45 degrees relative to the ejection surface and is configured to reflect light emitted from the LED die toward the ejection surface.

4. The light source module as claimed in claim 1, wherein the light pipe is adhered to the pipe holder and the lateral surface of the light guide member.

5. The light source module as claimed in claim 1, wherein the pipe holder further comprises an electrical contact configured to electrically coupled to an exposing part of the lead frame when the at least one light guide member is inserted into the receiving hole.

6. The light source module as claimed in claim 1, wherein the at least one light guide member encapsulates the LED die and the part of the lead frame by injection molding.

7. The light source module as claimed in claim 1, wherein the pipe holder is made of infrared-opaque material and further comprises an infrared pass filter.

8. The light source module as claimed in claim 1, wherein the light pipe is co-injection molded with the light guide member and the lateral surface is not coated with the reflection film, and a material refractive index of the light pipe is lower than a material refractive index of the light guide member.

9. The light source module as claimed in claim 1, further comprising a bearing member covering an opposite surface of the ejection surface of the light guide member, wherein the opposite surface is not coated with the reflection film, and a material refractive index of the bearing member is lower than a material refractive index of the light guide member.

10. The light source module as claimed in claim 1, wherein the light guide member further comprises a saw tooth structure or a reticulated structure to allow light emitted from the LED die to eject from the light guide member via the saw tooth structure or the reticulated structure.

11. A light source module comprising:
a pipe holder; and
at least one light guide member combined to the piper holder and comprising an ejection surface, a tilted surface and an LED die embedded at an end of the light guide member far from the tilted surface, wherein the tilted surface is configured to reflect light emitted from the LED die toward the ejection surface,
wherein the pipe holder comprises at least one receiving hole configured to accommodate the end of the at least one light guide member at which the LED die embedded.

12. The light source module as claimed in claim 11, wherein at least a part of the ejection surface and surfaces other than the ejection surface of the light guide member are coated with a reflection film.

13. The light source module as claimed in claim 11, wherein the at least one light guide member further comprises a saw tooth structure or a reticulated structure to allow the light emitted from the LED die to eject from the at least one light guide member via the saw tooth structure or the reticulated structure.

14. The light source module as claimed in claim 11, wherein the pipe holder further comprises an infrared pass filter disposed corresponding to the LED die.

15. The light source module as claimed in claim 11, wherein the tilted surface has an included angle of 45 degrees relative to the ejection surface.

16. The light source module as claimed in claim 11, wherein the pipe holder further comprises an electrical contact electrically coupled to a power source.

17. A light source module comprising:
an LED die;
a lead frame electrically coupled to the LED die;
a light guide member encapsulating the LED die and a part of the lead frame, and comprising at least one tilted surface opposite to the LED die, wherein a part of an ejection surface of the light guide member is coated with a reflection film; and
a light pipe being co-injection molded with the light guide member to be combined to a lateral surface of the light guide member, wherein the lateral surface of the light guide member is not coated with the reflection film, and a material refractive index of the light pipe is lower than a material refractive index of the light guide member.

18. The light source module as claimed in claim 17, wherein the light guide member comprises a plurality of tilted surfaces having different tilted angles.

19. The light source module as claimed in claim 17, wherein the at least one tilted surface has an included angle of 45 degrees relative to the ejection surface and is configured to reflect light emitted from the LED die toward the ejection surface.

20. The light source module as claimed in claim 17, wherein the light guide member further comprises a saw tooth structure or a reticulated structure to allow light emitted from the LED die to eject from the light guide member via the saw tooth structure or the reticulated structure.

* * * * *